(12) United States Patent
Hall

(10) Patent No.: US 6,252,336 B1
(45) Date of Patent: Jun. 26, 2001

(54) COMBINED PIEZOELECTRIC SILENT ALARM/BATTERY CHARGER

(75) Inventor: Dale G. Hall, Cedar Crest, NM (US)

(73) Assignee: CTS Corporation, Elkhart, IN (US)

( * ) Notice: Subject to any disclaimer, the term of this patent is extended or adjusted under 35 U.S.C. 154(b) by 0 days.

(21) Appl. No.: 09/435,878

(22) Filed: Nov. 8, 1999

(51) Int. Cl.[7] .................................................. H01L 41/113
(52) U.S. Cl. .................................................. 310/339; 310/319
(58) Field of Search ........................................ 310/319, 339, 310/316.01, 317, 348, 351, 353

(56) References Cited

U.S. PATENT DOCUMENTS 3,093,760  *  6/1963  Tarasevich ............................. 310/348
3,456,134  *  7/1969  Ko ......................................... 310/319
4,565,940  *  1/1986  Hubbard ................................ 310/326
5,552,656  *  9/1996  Taylor ................................... 310/319
5,621,264  *  4/1997  Epstein et al. ........................ 310/339
5,703,295  * 12/1997  Ishida et al. .......................... 310/339
5,751,091  *  5/1998  Takahashi et al. .................... 310/339

FOREIGN PATENT DOCUMENTS 2 095 053  *  9/1982  (GB) .................................... 310/319
44-26339  * 11/1969  (JP) ..................................... 310/319

* cited by examiner

Primary Examiner—Thomas M. Dougherty

(57) ABSTRACT

A communication device such as a pager or cellular telephone which requires battery power, uses a piezoelectric device as both a vibrating silent alarm and a battery charger.

13 Claims, 2 Drawing Sheets

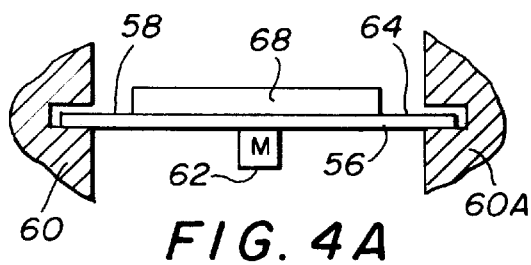
FIG. 4A
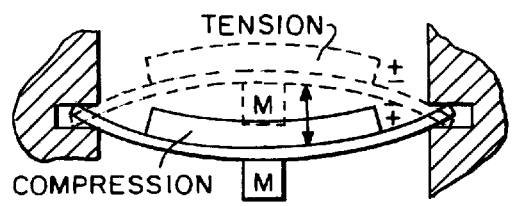
FIG. 4B
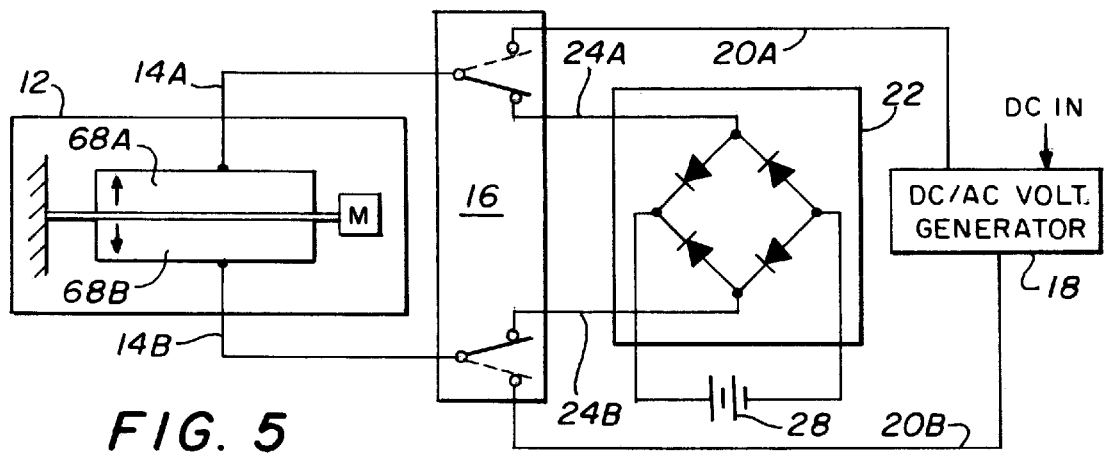
FIG. 5
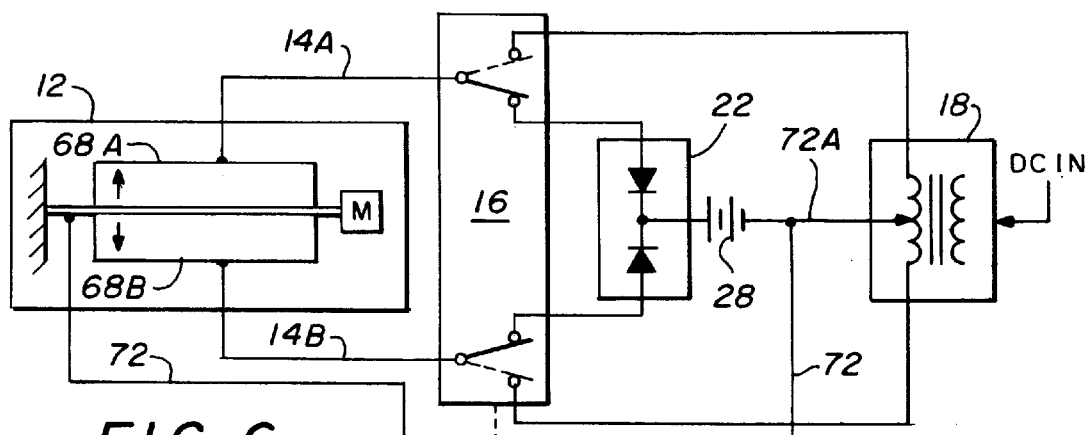
FIG. 6
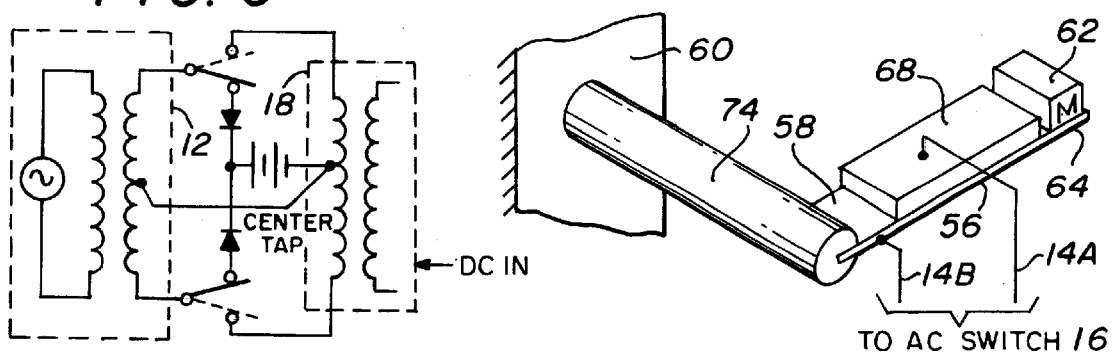
FIG. 7
FIG. 8

COMBINED PIEZOELECTRIC SILENT ALARM/BATTERY CHARGER

BACKGROUND OF THE INVENTION

1. Field of the Invention

The present invention relates to portable communication devices such as pagers and cellular telephones and more particularly to the use of a piezoelectric device which operates primarily as a battery charger for the communication device, but which can also be switched to act as a silent or vibration alarm to alert the user of an incoming call or page.

2. Description of Related Art Including Information Disclosed Under 37 CFR 1.97 and 1.98

The use of pagers and cellular telephones has increased at an almost explosive rate over the last decade. At the same time, the using public continues to demand that the pagers and cellular telephones be smaller and less obtrusive while at the same time have a longer and longer service time before the batteries are exhausted. The miniaturization of such devices has been largely successful. However, one of the physically largest and heaviest components has always been and continues to be the battery that powers the device. Thus, it is seen that the demands for both miniaturization and longer service time are in conflict and present an engineering challenge.

In the past, these conflicting demands had been partially solved by significantly increasing the efficiency of the battery to allow for longer use with smaller batteries. In addition, miniaturization of the communication device circuitry components has also helped solve the problem. However, circuit components are now very small and unfortunately further miniaturization may help somewhat in power consumption, but the actual weight and size of most of the components are so small that further reduction could be of little benefit. There are a few components, such as for example the housing or case of the device and the keypads used for dialing in a cellular telephone where further size reduction is extremely difficult since if the keys are not spaced sufficiently apart from each other it becomes difficult to select a single key. One component used by both pagers and cellular telephones which uses a significant amount of energy, is expensive, and rather large is the silent or vibration alarm. Typically, a small electrical motor is used to drive or rotate an unbalanced wheel to cause vibration to provide the silent alarm. These motors simply cannot be made much smaller and still drive a large enough vibration device to be useful. Further, in addition to being a relatively expensive component of the communication device, when actually operating they use a significant amount of the available battery power.

SUMMARY OF THE INVENTION

Therefore, it is an object of the present invention to provide methods and apparatus to allow further reduction of size and weight of a battery used in portable devices.

It is another object of the present invention to provide an inexpensive mechanism to provide vibration for a silent alarm.

It is still a further object of the present invention to provide a silent alarm mechanism which has a low overall resulting power use.

These and other objects are achieved by the piezoelectric device of this invention which selectively provides either vibration to the device or generates current responsive to movement as the device is carried or moved. The apparatus comprises an elongated support beam which extends along a first axis between first and second ends. The elongated support beam may be made of an electrically conductive material, or alternately may be made of a non-conductive material such as fibreglass and have a conductive layer or conductive portion. The elongated support beam is flexible and resilient along a second axis which second axis is substantially perpendicular to or across said first axis of the elongated support beam. A weight member is attached to the elongated support beam so as to cause flexure of the elongated support beam in response to movement of the communication device. A piezoelectric device having a first side (positive) and a second side (negative) is mounted to the conductive portion of the elongated support beam. A first conductor is connected so as to be an electrical contact with one side (negative) of the piezoelectric device and a second conductor is electrically connected to the other side of the piezoelectric device. A rectifier is provided which has an input and an output, and is connected such that the first and second conductors are electrically connected to the input of the rectifier and a selected load is connected to the output of the rectifier such that flexure of the elongated support beam causes distortion of the piezoelectric device thereby creating a current flow through the first and second conductors and then through the rectifying device to the selected load and battery. In a preferred embodiment, the piezoelectric device of this invention also further comprises an AC power source such as a DC to AC convertor and a switch connected between at least one of the first and second conductors and the rectifying device. The switch is also connected to the AC power source. The switch operates to selectively connect only one of the rectifying devices or the AC power source at a time to the first and second conductors. Thus, AC power may be provided to the piezoelectric device when the rectifying device is disconnected such that the piezoelectric device will continually be distorted and relaxed in response to the electrical current thereby causing a bending movement of the elongated support member and vibration of the device. It is this resulting vibration that then acts as a silent alarm for communication devices according to the present invention.

BRIEF DESCRIPTION OF THE DRAWINGS

These and other features of the present invention will be more fully disclosed when taken in conjunction with the following Detailed Description of the Invention in which like numerals represent like elements and in which:

FIGS. 4A and 4B show a second embodiment of the elongated support beam, piezoelectric device, and weight member which may be used with the present invention;

FIG. 5 is a diagrammatic view of still another embodiment of the combination vibration and battery charger of the present invention using two piezoelectric stacks;

FIG. 6 is yet another embodiment of the present invention similar to that of FIG. 5 except the device uses a different technique to rectify the generated AC current;

FIG. 7 shows an equivalent electrical circuit of the rectifying device of FIG. 6; and FIG. 8 is an embodiment wherein the cantilever is mounted to a torsion spring.

DETAILED DESCRIPTION OF THE INVENTION

Figure 1:
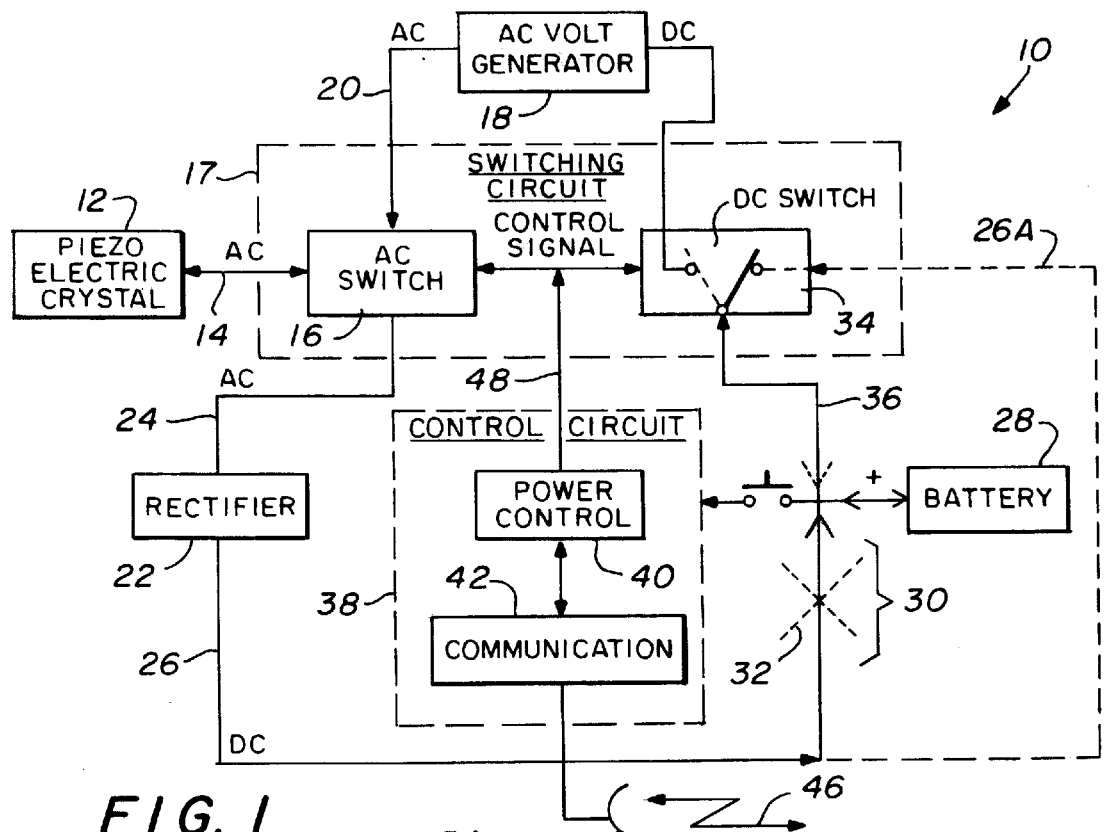
FIG. 1 is a simplified block diagram of a communication device incorporating the teachings of the present invention.

Referring now to FIG. 1, there is shown generally at 10 a piezoelectric device structure 12 which both receives and provides AC currents as indicated by double headed arrow 14 to an AC switch 16 which is part of switching circuitry 17. AC switch 16 is connected so as to selectively connect the piezoelectric device structure 12 to an AC power source 18 by conductor 20 and a rectifying device 22 by conductor 24. AC power source 18 could be any type of AC voltage generator and preferably is a DC to AC convertor. It should be appreciated that the conducting lines 14, 20 and 24 although shown as single lines may actually represent a pair of conductors. Also shown is a battery 28 which may receive power for charging from rectifier 22, or may provide power to the DC to AC connector or AC voltage generator 18 which then produces AC power. The DC power from rectifier 22 may go directly to the positive terminal of battery 28 as indicated by solid line 26 or alternately the portion 30 of line 26 may be removed as indicated by the dashed "X" 32. If the connection between the rectifier 22 and battery 28 is direct, the DC power from line 26 will be provided to a DC switch 34 as indicated by dashed line 26a and then provided to battery 28 by line 36. DC switch 34 also selectively provides battery power to the AC voltage generator 18 through switch 34. Also included in the device of FIG. 1, is a control circuit 38 which includes a power control portion 40 and a communication circuit 42. Communication circuit 42 is typically connected to an antenna 44 for receive RF communications representing pager signals or cellular telephone signals. In the embodiment shown the power control circuit 40 provides a control signal to the AC switch 16 and the DC switch 34 of switching circuitry 17. Although a single control signal is shown going to both the AC switch 16 and the DC switch 34 by means of line 48 it will be appreciated that the power control circuit 40 could provide individual signals to AC switch 16 and DC switch 34.

Typical operation of the communication device shown in FIG. 1 could proceed as follows: AC switch 16 would typically provide normally closed contacts between the piezoelectric device 12 and the rectifier 22 such that for most situations the piezoelectric device 12 and rectifier 22 are connected. Upon receipt of the control signal on line 48, the AC switch 16 would be activated such that the switch contacts between piezoelectric device 12 and rectifier 22 are now open and the contacts between piezoelectric device 12 and AC power source or DC to AC connector 18 are closed. However, the control signal on line 48 from power control circuit 40 typically will only be provided to alert the user of the communication device of an incoming call or page. That is, when the communication device 42 receives a paging signal or incoming call signal 46 through antenna 44, communication device 42 will send a signal to power control circuit 40 which in turn will switch the status of AC switch 16 such that the normally closed contacts between piezoelectric device 12 and rectifier 22 are opened and the normally open contacts between piezoelectric device 12 and AC driver voltage generator 18 are closed. Thus, as will be explained in more detail hereinafter, and as will be appreciated by those skilled in the art, piezoelectric device 12 will normally provide electrical power through rectifier 22 to charge battery 28 except when it is necessary to alert the user of an incoming call or page.

Figure 2:
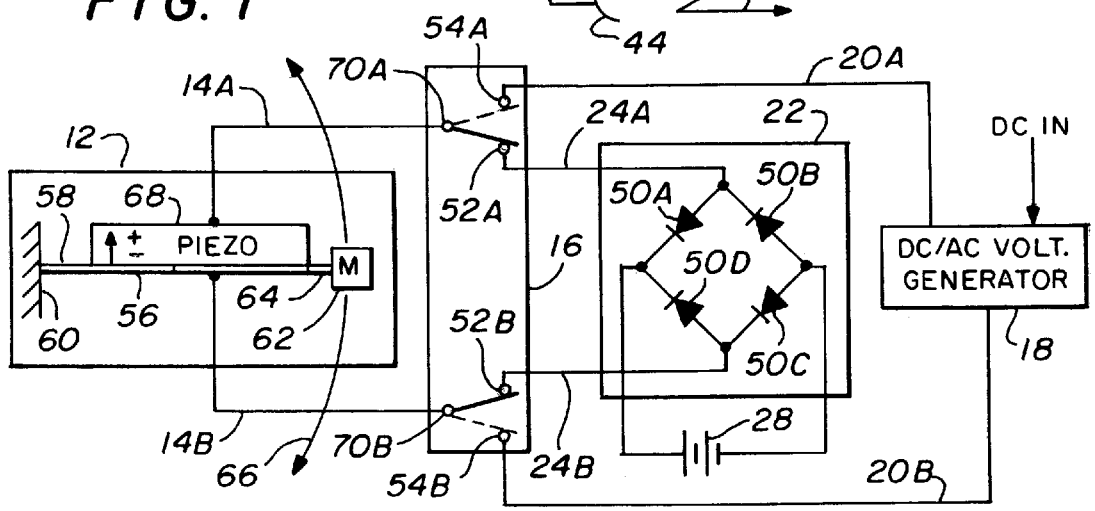
FIG. 2 is a simplified diagram of circuitry in the piezoelectric device which operates as a combined battery charger and silent alarm according to a first embodiment of the present invention.

Referring now to FIG. 2, there is shown a more detailed representation of a first embodiment of the present invention. In FIG. 2, as well as other figures discussed hereinafter, components which are common to the different embodiments will carry the same reference number. Thus, as shown in FIG. 2 piezoelectric device 12 is still shown as being connected through AC switch 16 selectively to either the AC power source 18 or the rectifying device 22. Also as shown, rectifying device 22 is connected to battery 28. According to this embodiment, a full wave bridge rectifier using four diodes 50a, 50b, 50c and 50d are connected so as to comprise the rectifier 22. The output of the rectifier 22 is connected to battery 28. It will be noted that according to this embodiment, the contacts 52a and 52b of AC switch 16 are normally closed such that the piezoelectric device 12 is connected to the rectifying device except when the switch 16 is activated. The normally open contacts 54a and 54b are shown as being connected to the AC power source 18. Further, in the embodiment of FIG. 2 the piezoelectric device 12 is shown as being comprised of an elongated flexible support beam 56 which is rigidly attached at a first end 58 to a rigid support structure 60. A weight member 62 is attached to a second end 64 of the elongated support beam 56. Thus, the support beam 56 is a cantilever rigidly attached at one end and having a weight or mass at the other end such that the mass will tend to vibrate or move in a single plane as indicated by the double headed arcuate arrow 66. It will be appreciated by those skilled in the art that any substantial type of motion will create acceleration forces on the mass such that the mass will tend to oscillate back and forth along the arcuate arrow 66 and eventually finally come to rest once the outside movement ceases and the dampening forces cause the movement of the mass to be less and less. Therefore, it will be appreciated that if one assumes that the communication device is a pager or cellular telephone carried by an individual who is walking or moving such minor and normal motions will result in the oscillation of the mass 62 and the elongated support beam 56. Typically, the elongated support beam 56 will be of a conductive resilient material or alternately could comprise a flexible insulating material such as fiberglass, composite material or the like and for certain embodiments of the invention would also require a conductive covering or portions attached thereto. Securely attached to the elongated support beam 56 is at least one piezoelectric stack 68. In the embodiment shown, the piezoelectric stack 58 is attached with its negative portion or a first side in electrical contact with the conductive portion of elongated support beam 56. Also attached to the negative portion of piezoelectric stack 58 is conductor 14b which in the embodiment of FIG. 2 is shown connected to the common contact 70b of switch 16. The second side or positive portion of piezoelectric stack 68 is shown as being connected to the common contact 70a of switch 16. Thus, as will be appreciated by those skilled in the art, movement of the support beam 56 and mass 62 will result in piezoelectric crystal or device 68 being repeatedly stressed and relaxed due to the bending of the elongated member 56 such that an AC current is created through conductors 14a and 14b. This AC current is provided to rectifying bridge 22 where the AC voltage or current is rectified such that a DC voltage is produced and then used to charge battery 28. Although not shown, it will be appreciated of course, that some type of voltage regulation at the output of rectifier 22 may be desirable to better regulate the charge voltage applied to battery 28.

In the event of an incoming page or call on a cellular telephone, as was discussed earlier the rectifier will be disconnected from the piezoelectric device 12 by means of switch 16 and the AC voltage generator will be connected. It will be appreciated that although almost any AC voltage generator having a correct voltage and frequency output would operate satisfactory, according to a preferred embodiment a simple DC to AC convertor is used. Thus, an AC signal will be supplied to the negative and positive sides of piezoelectric device 68 through conductors 14a and 14b which, as will be appreciated by those skilled in the art, will force the piezoelectric device into a continuous stressed and relaxed condition (such as tension/relaxation/compression) in response to the AC signal. These changes between a tension and compression condition of the piezoelectric device will act on the elongated support beam 56 such that it will start vibrating. The vibration will then be sensed by the user of the communication device who will be alerted of an incoming call or page.

Figure 3:
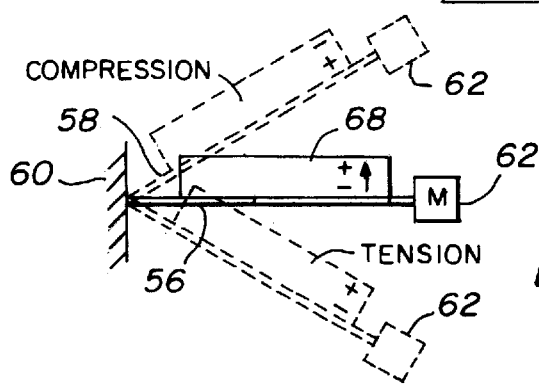
FIG. 3 is a diagrammatic view of the elongated support beam, the weight member and the piezoelectric device of the present invention according to one embodiment of the present invention.

Referring now to FIG. 3, there is shown an diagrammatical view of the piezoelectric device 12 illustrating how the piezoelectric stack 68 is compressed when the mass is in the upward portion of its movement and is in tension when the mass or beam are in their lower portion of their movement.

It will also be appreciated by those skilled in the art that the cantilever attached elongated support member 56 although believed to be the preferred embodiment is not the only way the concepts and teachings of this invention may be employed. For example, referring now to FIGS. 4A and 4B there is shown another embodiment for supporting the elongated support beam 58, the mass 62 and the piezoelectric device 68. According to this embodiment, both the first end 58 and the second end 64 are supported by the support structures 60 and 60a. Furthermore, the mass or weight member 62 is located at a more central or midpoint of the beam as shown in the drawing. The piezoelectric device 68 is mounted between the two ends 58 and 64 of the elongated support member 56. FIG. 4b illustrates the movement of the elongated support beam and the flexing of the support beam which results in the tension and compression of the piezoelectric device thereby causing it to create an AC current which is rectified and used to charge battery 28 in a manner as was discussed heretofore. Likewise, if the piezoelectric device 68 is disconnected from rectifying device 22 and instead receives an AC current from AC voltage generator 18, the piezoelectric device will be alternately forced into compression and tension as shown in FIG. 4b and result in the vibration of the structure which will then be sensed by the user of the device and alerted to an incoming call or page.

Referring now to FIG. 5 there is shown still another embodiment of the present invention wherein the piezoelectric device 12 uses a pair of piezoelectric stacks 68a and 68b. In this embodiment one of the stacks will be in compression when the other is in tension and vice versa. The operation of this embodiment is substantially identical to that discussed with respect to FIG. 2, except that the voltage output from the piezoelectric device 12 to the rectifier 22 will substantially be doubled.

FIG. 6 shows still another embodiment of the present invention wherein the rectifier 22 uses two diodes rather than the four diodes as used by the rectifier discussed with respect to FIG. 2. This rectifier using only two diodes can only operate with a piezoelectric device 12 which uses a pair of piezoelectric stacks 68a and 68b. The operation of this circuitry is substantially the same as that discussed with respect to FIG. 5 except that the circuit acts as a full wave center tap bridge. Thus, according to this circuit, it is also necessary to further include a conductor 72 which connects the negative terminal of the battery 28 to the negative portions of both piezoelectric devices 68a and 68b. This device will also require a center tap output of the AC voltage generator (or DC to AC convertor) 18 as indicated by the short conductor 72a.

FIG. 7 illustrates an equivalent electrical circuit of the arrangement shown in FIG. 6.

The cantilever beam 56 and single piezoelectric device shown in the embodiment of FIG. 8 along with the electrical circuitry is substantially the same as that shown in FIG. 2. However, instead of end 58 of cantilever 56 being rigidly connected to support structure 60, there is included a torsion spring member 74. As shown in FIG. 8, torsion spring member 74 is rigidly connected at one end 76 to support structure 60, and the first end 58 of cantilever beam 56 is rigidly connected to the free end of torsion spring 74. This arrangement is selected to change the natural frequency of the device to about +25 Hz to about 250 Hz. A frequency of between about 75 Hz to about 125 Hz improves the "feel" to the wearer when the device is in the alarm or vibration mode. It will also be appreciated that the use of the torsion spring member 74 could also be used with the embodiment shown in FIGS. 5 and 6.

The corresponding structures, materials, acts, and equivalents of all means or step plus function elements in the claims below are intended to include any structure, material, or act for performing the function in combination with other claimed elements as specifically claimed.

What is claimed is:

1. A piezoelectric current generating device responsive to movement and vibration comprising:

an elongated support beam extending along a first axis between first and second ends, said elongated support beam being flexible and resilient along a second axis, said second axis being substantially perpendicular to said first axis of said elongated support beam;

a weight member attached to said elongated support beam to cause flexure of said elongated support beam in response to vibration or movement of said support beam and said weight member;

first and second piezoelectric devices each having a positive side and a negative side, each of said negative sides in electrical contact with each other mounted to said elongated support beam;

a first conductor in electrical contact with said positive side of said first piezoelectric device and a second conductor in electrical contact with said positive side of said second piezoelectric device;

a rectifying device having an input and an output, said first and second conductors electrically connected to said input of said rectifying device and a selected load connected to said output of said rectifying device such that flexure of said elongated support beam causes distortion of said first and second piezoelectric devices thereby creating a current flow through said first and second conductors and then through said rectifying device and to said selected load; and an AC power source and a switch connected between at least one of said first and second conductors and said rectifying device and being further connected to said AC power source, said switch operating to selectively connect only one of said rectifying device and said AC power source at a time to said first and second conductors such that when the rectifier is connected a DC charging current is generated and when the AC power source is connected the elongated beam and weight member are forced to vibrate.

2. The device of claim 1 used in a portable communication device and further comprising communication circuitry to contact said switch to disconnect said rectifier and connect said AC power source to alert a user of an incoming communication.

3. A piezoelectric current generating device responsive to movement and vibration comprising:

an elongated support beam extending along a first axis between first and second ends, said elongated support beam being flexible and resilient along a second axis, said second axis being substantially perpendicular to said first axis of said elongated support beam;

a weight member attached to said elongated support beam to cause flexure of said elongated support beam in response to vibration or movement of said support beam and said weight member;

first and second piezoelectric devices each having a positive side and a negative side, each of said negative sides in electrical contact with each other mounted to said elongated support beam;

a first conductor in electrical contact with said positive side of said first piezoelectric device and a second conductor in electrical contact with said positive side of said second piezoelectric device;

a full wave bridge rectifier having an input and an output, said first and second conductors electrically connected to said input of said rectifying device and a selected load connected to said output of said rectifying device such that flexure of said elongated support beam causes distortion of said first and second piezoelectric devices thereby creating a current flow through said first and second conductors and then through said rectifying device and to said selected load; and an AC power source and a switch connected between at least one of said first and second conductors and said rectifying device and being further connected to said AC power source, said switch operating to selectively connect only one of said rectifying device and said AC power source at a time to said first and second conductors such that when the rectifier is connected a DC charging current is generated and when the AC power source is connected the elongated beam and weight member are forced to vibrate.

4. The device of claim 3 used in a portable communication device and further comprising communication circuitry to contact said switch to disconnect said rectifier and connect said AC power source to alert a user of an incoming communication.

5. A piezoelectric current generating device responsive to movement and vibration comprising:

an elongated support beam extending along a first axis between first and second ends, said elongated support beam being flexible and resilient along a second axis, said second axis being substantially perpendicular to said first axis of said elongated support beam;

a weight member attached to said elongated support beam to cause flexure of said elongated support beam in response to vibration or movement of said support beam and said weight member;

first and second piezoelectric devices each having a positive side and a negative side, each of said negative sides in electrical contact with each other mounted to said elongated support beam;

a first conductor in electrical contact with said positive side of said first piezoelectric device and a second conductor in electrical contact with said positive side of said second piezoelectric device;

a rectifying device having an input and an output, said first and second conductors electrically connected to said input of said rectifying device and a selected load connected to said output of said rectifying device such that flexure of said elongated support beam causes distortion of said first and second piezoelectric devices thereby creating a current flow through said first and second conductors and then through said rectifying device and to said selected load;

wherein said elongated beam includes a conductive portion and said negative sides of each of said first and second piezoelectric devices are in electrical contact with said conductive portion of said elongated support beam and said rectifying device comprises a pair of diodes having their anodes connected one each to said first and second conductors and the cathodes of both diodes connected to said conductive portion of said elongated support beam.

6. The device of claim 5 and further comprising an AC power source and a switch connected between at least one of said first and second conductors and said rectifying device and being further connected to said AC power source, said switch operating to selectively connect only one of said rectifying device and said AC power source at a time to said first and second conductors such that when the rectifier is connected a DC charging current is generated and when the AC power source is connected the elongated beam and weight member are forced to vibrate.

7. The device of claim 6 used in a portable communication device and further comprising communication circuitry to contact said switch to disconnect said rectifier and connect said AC power source to alert a user of an incoming communication.

8. A piezoelectric current generating device responsive to movement and vibration comprising:

an elongated support beam extending along a first axis between first and second ends, said elongated support beam being flexible and resilient along a second axis, said second axis substantially perpendicular to said first axis of said elongated support beam;

a weight member attached to said elongated support beam to cause flexure of said elongated support beam in response to movement of said support beam and said weight member;

a piezoelectric device having a positive side and a negative side, said negative side mounted to said elongated support beam;

a first conductor in electrical contact with said positive side of said piezoelectric device and a second conductor electrically connected to said negative side of said piezoelectric device;

a rectifier having an input and an output, said first and second conductors electrically connected to said input of said rectifying device and a selected load connected to said output of said rectifying device such that flexure of said elongated support beam causes distortion of said piezoelectric device thereby creating a current flow through said first and second conductors and then through said rectifying device to said selected load; and an AC power source and a switch connected between at least one of said first and second conductors and said rectifying device and being further connected to said AC power source, said switch operating to selectively connect only one of said rectifying device and said AC power source at a time to said first and second conductors such that when the rectifier is connected a DC charging current is generated and when the AC power source is connected the elongated beam and weight member are forced to vibrate.

9. The device of claim 8 used in a portable communication device and further comprising communication circuitry to contact said switch to disconnect said rectifier and connect said AC power source to alert a user of an incoming communication.

10. A piezoelectric current generating device responsive to movement and vibration comprising:

an elongated support beam extending along a first axis between first and second ends, said elongated support beam being flexible and resilient along a second axis, said second axis being substantially perpendicular to said first axis of said elongated support beam;

a weight member attached to said elongated support beam to cause flexure of said elongated support beam in response to vibration or movement of said support beam and said weight member;

first and second piezoelectric devices each having a positive side and a negative side, each of said negative sides in electrical contact with each other mounted to said elongated support beam;

a first conductor in electrical contact with said positive side of said first piezoelectric device and a second conductor in electrical contact with said positive side of said second piezoelectric device;

a rectifying device having an input and an output, said first and second conductors electrically connected to said input of said rectifying device and a selected load connected to said output of said rectifying device such that flexure of said elongated support beam causes distortion of said first and second piezoelectric devices thereby creating a current flow through said first and second conductors and then through said rectifying device and to said selected load; and a support structure and an elongated torsion spring member having one end rigidly connected to said support structure and wherein said elongated support beam is a cantilever having said first end rigidly attached to and extending from the unattached end of said elongated torsion spring, and said second end free to move, said weight member being attached to said cantilever proximate said second end and said elongated torsion spring being selected to provide a natural vibration of between about 25 Hz to about +250 Hz to said device.

11. The device of claim 10 wherein said elongated torsion spring is selected to provide a natural vibration of between about 75 Hz to about 125 Hz.

12. A piezoelectric current generating device responsive to movement and vibration comprising:

an elongated support beam extending along a first axis between first and second ends, said elongated support beam being flexible and resilient along a second axis, said second axis substantially perpendicular to said first axis of said elongated support beam;

a weight member attached to said elongated support beam to cause flexure of said elongated support beam in response to movement of said support beam and said weight member;

a piezoelectric device having a positive side and a negative side, said negative side mounted to said elongated support beam;

a first conductor in electrical contact with said positive side of said piezoelectric device and a second conductor electrically connected to said negative side of said piezoelectric device;

a rectifier having an input and an output, said first and second conductors electrically connected to said input of said rectifying device and a selected load connected to said output of said rectifying device such that flexure of said elongated support beam causes distortion of said piezoelectric device thereby creating a current flow through said first and second conductors and then through said rectifying device to said selected load; and a support structure and an elongated torsion spring member having one end rigidly connected to said support structure and wherein said elongated support beam is a cantilever having said first end rigidly attached to and extending from the unattached end of said elongated torsion spring, and said second end free to move, said weight member being attached to said cantilever proximate said second end and said elongated torsion spring being selected to provide a natural vibration of between about 25 Hz to about 250 Hz to said device.

13. The device of claim 12 wherein said elongated torsion spring is selected to provide a natural vibration of between about 75 Hz to about 125 Hz.

* * * * *